(12) United States Patent
Miller

(10) Patent No.: US 7,474,123 B1
(45) Date of Patent: Jan. 6, 2009

(54) METHOD FOR REDUCING POWER CONSUMPTION WITH CONFIGURABLE LATCHES AND REGISTERS

(75) Inventor: Michael Raymond Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/839,829

(22) Filed: Aug. 16, 2007

(51) Int. Cl.
*G06F 7/38* (2006.01)
*H03K 19/173* (2006.01)

(52) U.S. Cl. .................................................. 326/46

(58) Field of Classification Search .................. 326/46; 327/544
See application file for complete search history.

(56) References Cited

U.S. PATENT DOCUMENTS

| | | | |
|---|---|---|---|
| 5,473,571 A * | 12/1995 | Shigematsu et al. ......... | 365/227 |
| 5,719,878 A | 2/1998 | Yu et al. | |
| 5,724,553 A | 3/1998 | Shigeeda | |
| 5,835,448 A | 11/1998 | Ohtani et al. | |
| 6,229,750 B1 * | 5/2001 | Correale et al. ............. | 365/226 |
| 6,850,456 B2 | 2/2005 | Asano et al. | |

* cited by examiner

*Primary Examiner*—James H. Cho
*Assistant Examiner*—Matthew C Tabler
(74) *Attorney, Agent, or Firm*—Sawyer Law Group LLP

(57) ABSTRACT

Reducing power consumption in latches and similar electronic devices. In one aspect, an apparatus for configuring power consumption of sequential logic includes a sequential logic device including a first latch, a second latch, and first and second enable inputs. The first enable input enables and disables the first and second latches, and the second enable input enables and disables the second latch and does not affect the first latch. The first enable input has an earlier required signal arrival time than the second enable input to be effective for a particular clock cycle. A circuit configures the sequential logic device at operating time to consume less power during a lower frequency of operation of the sequential logic device, and to consume more power during a higher frequency of operation.

16 Claims, 2 Drawing Sheets

METHOD FOR REDUCING POWER CONSUMPTION WITH CONFIGURABLE LATCHES AND REGISTERS

FIELD OF THE INVENTION

The present invention relates to latches and similar devices in electric circuits, and more particularly to reducing power consumption of latches in circuits.

BACKGROUND OF THE INVENTION

When designing a semiconductor circuit, it is of great value to be able to reduce power consumption and increase the operating frequency of the circuit. However, increasing the operating frequency often makes some power saving techniques difficult or impossible to implement. For many circuits including sequential logic devices such as flip-flops and latches, power saving techniques may be scaled back or removed from a design in order to achieve the maximum frequency possible.

Since many semiconductor circuit designs will support a range of frequencies, the power saving techniques removed in order to achieve high frequencies could have been implemented for low frequency applications. In some cases, two separate designs can be implemented, one for low frequencies with enhanced power savings and one for high frequencies with reduced power savings. However, multiple such designs increases cost due to design creation, maintenance, and manufacturing, and reduces the flexibility of any one design.

Accordingly, what is needed is a single circuit design that can provide both high frequency operation with higher power consumption and power saving operation at lower frequencies for sequential logic devices. The present invention addresses such a need.

SUMMARY OF THE INVENTION

The invention of the present application relates to reducing power consumption in latches, flip-flop, and other sequential logic devices. In one aspect of the invention, an apparatus for configuring power consumption of sequential logic includes a sequential logic device including a first latch, a second latch, and first and second enable inputs. The first enable input enables and disables the first latch and the second latch, and the second enable input enables and disables the second latch and does not affect the first latch. The first enable input has an earlier required signal arrival time than the second enable input to be effective for a particular clock cycle. The apparatus also includes a circuit coupled to the sequential logic device and coupled to the first enable input and to the second enable input, the circuit configuring the sequential logic device at operating time to operate in a lower frequency mode that consumes less power during a lower frequency of operation of the sequential logic device, and to operate in a higher frequency mode that consumes more power during a higher frequency of operation of the sequential logic device.

In another aspect, a method for configuring power consumption of sequential logic includes selectively configuring a sequential logic device at operating time for one of a high frequency mode and a low frequency mode based on an operating frequency for the sequential logic device, wherein the sequential logic device can be configured for both modes, each mode active at a different time, and wherein the low frequency mode saves power consumption relative to the high frequency mode. Both a first latch and a second latch of the sequential logic device are disabled in the low frequency mode based on a first enable signal received at a first enable input when the first enable signal meets a required signal arrival time of the first enable input. The second latch and not the first latch are disabled in the high frequency mode based on a second enable signal and the first enable signal received at a second enable input when the first enable signal does not meet the required signal arrival time of the first enable input.

The present invention provides a latch, flip-flop or similar circuit that can be configured and programmed for higher frequency as well as lower frequency power-saving operation, after manufacture and at operating time of the circuit. This allows a single circuit to be used for multiple different operating environments having different frequencies.

DETAILED DESCRIPTION

The present invention relates to latches and similar devices in electric circuits, and more particularly to reducing power consumption of latches in circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the system implementations usable with the present invention can take a number of different forms. The present invention will also be described in the context of particular methods having certain steps. However, the method and system operate effectively for other methods having different and/or additional steps not inconsistent with the present invention.

To more particularly describe the features of the present invention, please refer to FIGS. 1-5 in conjunction with the discussion below.

Figure 1:
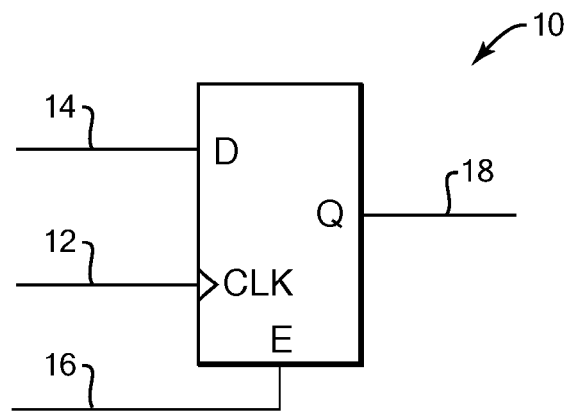
FIG. 1 is a schematic diagram of a D flip flop typically used in electronic applications.

FIG. 1 is a schematic diagram of a D flip flop 10 typically used in electronic applications. A typical D flip-flop, register, or latch can have three basic inputs, clock 12, data 14, and enable 16, and one basic output Q 18, which is the data out. The enable input 16, when asserted, allows the flip-flop to latch the data, and when the enable is negated, the output is not allow to change. The enable functionality may be required for correct logical behavior, but it is also used to save power, i.e., when the enable signal is turned off, the flip flop's operation is turned off and power consumption by the flip-flop 10 is reduced.

Figure 2:
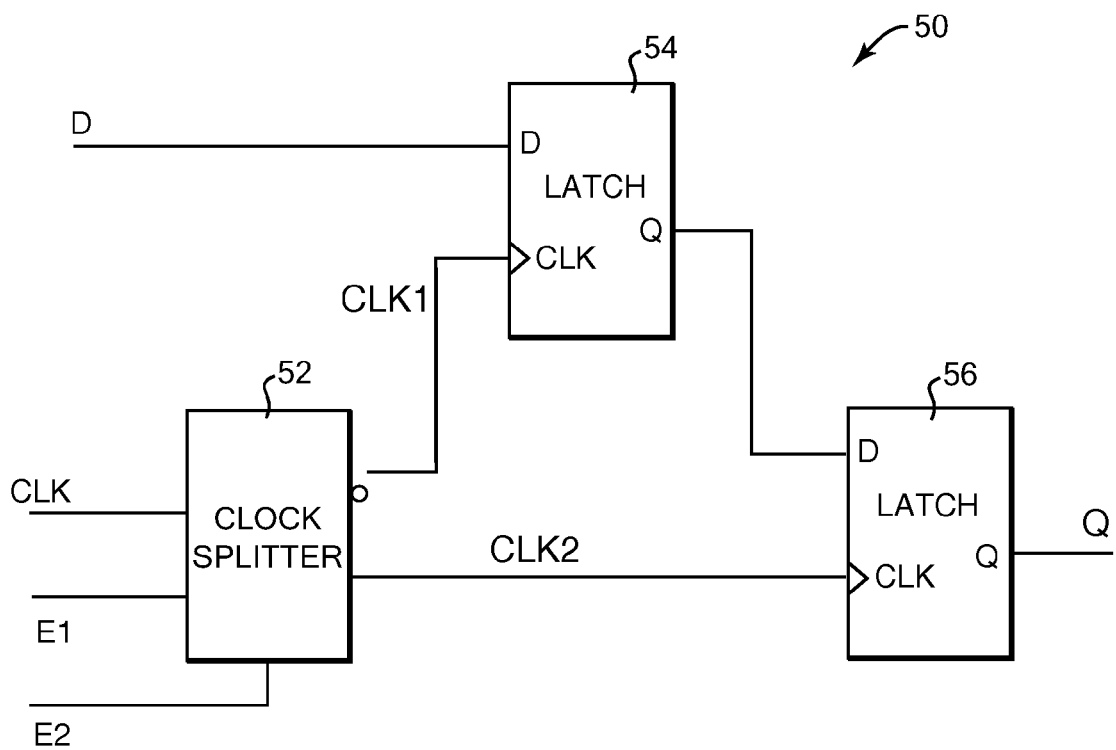
FIG. 2 illustrates a different flip-flop embodiment in which a master-slave latch design is used.

FIG. 2 illustrates a different flip-flop embodiment 50, in which a master-slave latch design is used. Flip-flop 50 has a clock splitter 52, a first latch 54, and a second latch 56. A clock signal CLK and two enables, E1 and E2, are input to the clock splitter 52. The outputs of the clock splitter include an inverted clock signal output CLK1 which is input to the clock input of first latch 54, and a non-inverted clock signal output CLK2 which is input to the clock input of second latch 56. A data signal D is input to the D input of the first latch 54. The output of first latch 54 is provided to the D input of second latch 56, and the output of second latch 56 is provided as the Q output of the entire master-slave latch 50. In the current example, the latches 54 and 56 sample data at the D input during the high pulse of the clock signal input to those respective latches. The operation of a similar master-slave latch is described in U.S. Pat. No. 6,229,750, which is incorporated herein by reference in its entirety.

Functionally, the combination (E1 AND E2) is equivalent to the enable input 16 of the register in FIG. 1. The difference is that E1 shuts off the clock to both the first and second latches 54 and 56, and E2 shuts off the clock to only the second latch 56 (both enables shut off the output of the entire flip-flop). Therefore, the E1 enable can save more dynamic power than the E2 enable, since both first and second latches will not be allowed to switch when E1 is negated (regardless of the E2 signal). The E1 enable, however, has an earlier required enable signal arrival time at the clock splitter than the E2 enable due to the additional requirement of turning off the first latch 54. Nominally, for the E1 enable to turn off the clock input, the required arrival time of the enable signal is at or earlier than halfway through the clock period, the halfway point being the falling edge of the clock cycle which is half of the clock cycle before the rising sampling edge of the clock signal. In contrast, the E2 enable's required arrival time is at or near the end of the clock period (e.g., such as within the last 10% of the clock period) just before the rising sampling edge of the clock signal.

Thus, due to these arrival requirements, E1 can limit the frequency of the signals used in the design if the most power savings are desired, such that E1 is used to turn off both latches in the flip-flop. In other embodiments, E1 can be asserted at all times to allow high frequency signals to be used on enable line E2, but this consumes more power since E2 only shuts off the second latch 56; the potential power savings of shutting off both latches, when turning off E1, is not realized.

Typically, designers try to use E1 enables as much as possible in order to save power. However, in the latter phases of the design (when finalizing the design), and prior to manufacture, timing analysis and tuning are performed to ensure that the design will meet required performance and frequency specifications. During this stage, if the signals going to the E1 enables are found to be the limiting paths to achieving the desired frequency of the design, the signals are moved to the E2 enable. This will increase power consumption as described above. The E1 enable will then either be permanently enabled or enabled more often (whichever is required to prevent it from being the performance limiting path of the chip). It should be noted that if the timing constraints of E1 were not an issue for high frequency operation, only the E1 enable would be used because of the power savings.

Thus, a single design of latch circuitry is desired which permits E1 timing to not be the gate to high frequency operation, yet which allows maximum latch power savings at lower frequencies, and is configurable at run time (or at least in post chip assembly).

Figure 3:
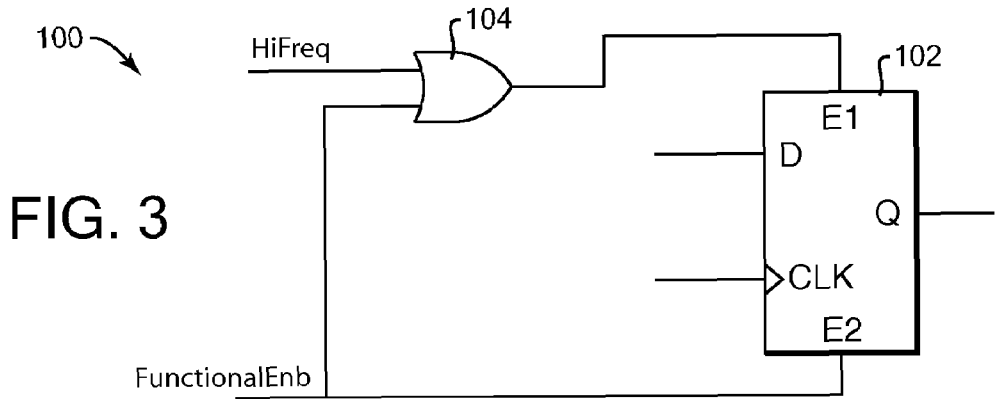
FIG. 3 is a schematic diagram illustrating a flip-flop circuit which overcomes the limitations of prior designs.

FIG. 3 is a schematic diagram illustrating a flip-flop circuit 100 which overcomes the above-described limitations of prior designs. FIG. 3 illustrates one embodiment including a flip-flop 102 and an OR gate 104. In the described embodiment flip-flop 102 is a master-slave flip-flop as described above with reference to FIG. 2.

It should be noted that although flip-flops or latches are generally described in the embodiments described herein, any types of "sequential logic devices" can be used in other embodiments of the invention, including flip-flops, latches, registers, etc.

A FunctionalEnb enable signal is input to the E2 enable input of the flip-flop 102 and also to the OR gate 104, and a HiFreq signal is provided as the other input to the OR gate 104. The output of the OR gate is connected to the E1 enable input of the flip-flop 102.

The FunctionalEnb signal is a combined enable signal providing enable signal functionality for a standard single enable of a flip-flop, i.e., the enable signals capable of being used with enable input E1 logically ANDed with the enable signals only capable of being used with enable input E2. Thus, the FunctionalEnb enable signal completely describes the enabling conditions (the required "enable" function) of the flip-flop 102. That is, if the E1 input did not exist, or if it assumed that the E1 input is always enabled, then the E2 enable (FunctionalEnb) would be sufficient for correct operation of the design.

HiFreq is a configuration signal that is provided by another circuit or controller to which the flip-flop circuit 100 is coupled. This signal is asserted when it is determined that a high frequency mode of operation of the flip flop is to be used, in which a sufficiently high number of enable signals sent to the flip-flop circuit 100 arrive late enough that there is not sufficient time to meet the arrival requirements of the E1 enable input, and so significant power savings cannot be realized. Likewise, HiFreq is de-asserted if a lower frequency operating mode is used in which a significant portion of enable signals arrive early enough to use enable input E1 and thus allow a significant decrease in power usage. The circuit designer can evaluate the power savings to determine whether the high frequency mode or low frequency mode should be selected for a particular application or use. For example, depending on the embodiment, the HiFreq signal can be permanently set after manufacture, e.g., at start-up of an electronic device in which the circuit 100 is included. In some embodiments the HiFreq signal can be changed during circuit operation. Typically, HiFreq should not change its state or value during the latching or sampling operation of flip-flop 102 for any of the embodiments described herein. The circuit of FIG. 3 can in some embodiments have a HiFreq signal that can change at any time, since the FunctionalEnb signal always is sent to enable input E2; however, if HiFreq is allowed to change at any time, it has timing requirements similar to the E1 enable input.

The circuit 100 operates as follows. If HiFreq is "on," E1 input is always enabled, and there will be minimal power savings for the flip-flop 102, since the first latch 54 is always on. E1 will not be a performance-limiting path (for high frequency operation), since it is always on. In such a state, the FunctionalEnb signal drives enable E2 for all enable signals, thus allowing the later response capability of the E2 input to control all the off times of flip-flop 102.

If HiFreq is "off", then it has been determined that the arriving enable signals arrive sufficiently early such that the E1 enable can be used to save additional power consumption. The E1 enable input is asserted by FunctionalEnb only when the E2 enable is also asserted. Thus there will be maximum power savings for the flip-flop 102 when HiFreq is "off", since the E1 input turns off both first and second latches of the flip-flop 102 (the E2 enable is irrelevant in such a case).

Embodiments such as FIG. 3 or similar embodiments (such as FIG. 5, described below) require the FunctionalEnb (E2) enable signal to have all the necessary logic to function as the only enable on the latch. The E1 enable is fed by logic that can be configured, at runtime, and that includes only those portions of the functional decode signals that can make E1-required arrival times. If none of the signals can make E1 timing at the highest frequency, the E1 enable would always be enabled by the asserted HiFreq signal (and thus, there is no timing miss since the value of E1 is not allowed to change).

Figure 4:
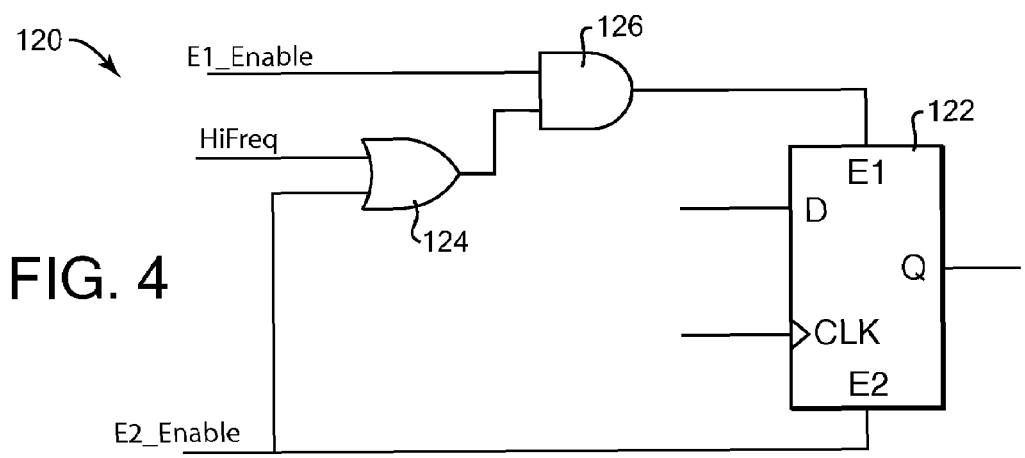
FIG. 4 is a schematic diagram illustrating an alternate flip-flop circuit which overcomes the limitations of prior designs.

FIG. 4 is a schematic diagram illustrating another embodiment of a flip-flop circuit 120 which overcomes the limitations of prior designs. Embodiment 120 includes a master-slave flip-flop 122 similar to the one described with reference to FIG. 2, an OR gate 124, and an AND gate 126.

An E1 enable signal is input to a first input of AND gate 126, and an E2 enable signal is input to the E2 enable input of the flip-flop 102 and also to the OR gate 124. A HiFreq signal is provided as the other input to the OR gate 124. The output of the OR gate is provided as the second input to the AND gate 126. The output of the AND gate 126 is connected to the E1 input of the flip-flop 122.

In circuit 120, the E1 enable signal is determined to make the required arrival time for the E1 input for the entire frequency range of operation and is thus capable of being used with enable input E1. The E2 enable signal as shown in FIG. 4 is for later-arriving data, e.g., enable signals that cannot make the E1 input required arrival time for the high frequency range, but can make the E1 required arrival time at lower frequencies. HiFreq is a configuration signal that is provided by a circuit or controller and is asserted when it is determined that the flip flop will operate in a high frequency mode in which many signals arrive too slowly (too late) to be used with enable input E1 and thus power consumption cannot be as reduced as when using a lower frequency mode of operation. Similarly, the HiFreq signal is kept low to put the flip-flop in a low frequency mode in which more earlier-arriving, fast enable signals arrive which can turn off both latches using enable input E1 and realize additional power savings.

The circuit 120 operates as follows. If HiFreq is "on," then the E1 enable signal controls at AND gate 126 whether the E1 input is on or off. HiFreq being "on" renders the E2 enable signal input to the OR gate 124 meaningless with respect to the E1 enable input of the flip-flop. Since the HiFreq signal is continuously asserted, an asserted E1 enable signal will always pass through the AND gate 126 to the E1 enable input. The E2 enable signal is provided to the E2 enable input to control the flip-flop 122 for slower, late-arriving enable signals. Since the E1 signal will sometimes be off, the high frequency mode of the embodiment of FIG. 4 allows some use of the E1 enable to turn off both latches 54 and 56 and achieve greater power savings, compared to the high frequency mode of the embodiment of FIG. 3 in which the E1 enable input is always on and thus the first latch is never turned off.

If HiFreq is "off," then the E1 enable signal and the E2 enable signal must both be high at the AND gate 126 to turn on the E1 enable input. When either or both enable signals are low, the E1 enable input is turned "off." Therefore, this low frequency configuration causes an asserted E1 enable signal to pass through the AND gate 126 to the E1 enable input less often than in high frequency mode (when HiFreq is "on"), thus causing the E1 enable to be "off" more often to realize greater power savings at a lower frequency of operation.

Figure 5:
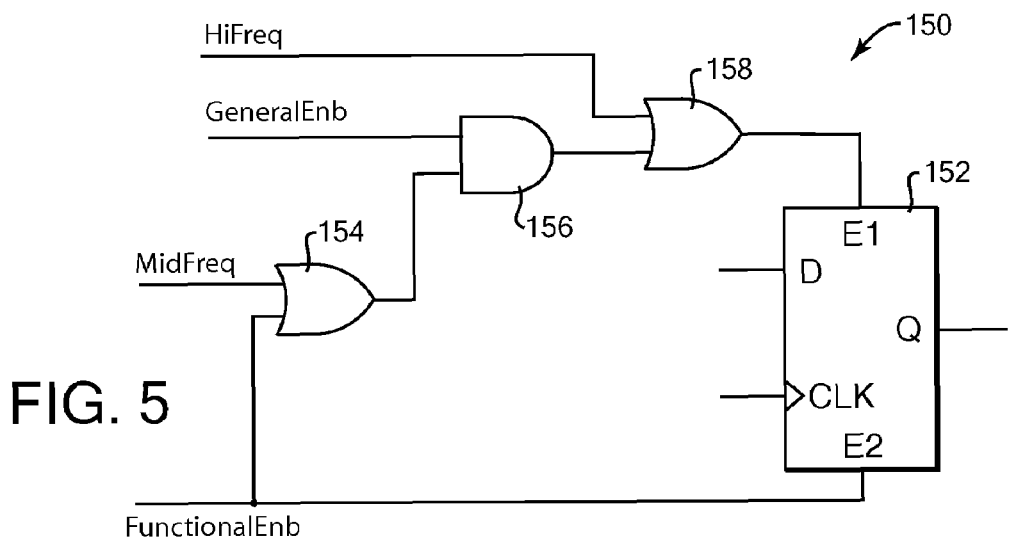
FIG. 5 is a schematic diagram illustrating another embodiment of a flip-flop circuit which overcomes the limitations of prior designs and includes the ability to handle additional frequency ranges.

FIG. 5 is a schematic diagram illustrating another embodiment of a flip-flop circuit 150 which overcomes the limitations of prior designs and can be configured for additional frequency ranges. Embodiment 150 includes a master-slave flip-flop 152 similar to the one described with reference to FIG. 2, an AND gate 154, an OR gate 156, and an OR gate 158. A FunctionalEnb enable signal is input to the E2 enable input of the flip-flop 152 and also to one input of OR gate 154. A MidFreq signal is provided to the other input of OR gate 154, and the output of the OR gate 154 is provided to one input of AND gate 156. A GeneralEnb signal is provided to the other input of AND gate 156, and the output of AND gate 156 is provided to one input of OR gate 158. A HiFreq signal is provided to the other input of the OR gate 158, and the output of the OR gate 158 is connected to the E1 enable input of the flip-flop 152.

The FunctionalEnb signal is a combined enable signal providing enable signal functionality for a standard single enable of a flip-flop, i.e., the enable signals capable of being used with enable input E1 logically ANDed with the enable signals only capable of being used with enable input E2. HiFreq is a configuration signal that is provided by a circuit or controller, and is asserted when it is determined that a high frequency mode of operation of the flip flop is to be used. GeneralEnb is an enable signal that is asserted when any enable signal is asserted, i.e., includes the on-times for both types of enable signals for E1 and E2, and meets the arrival requirements of the E1 enable input. Thus, GeneralEnb may be "on" more often than FunctionalEnb is "on," and GeneralEnb is always "on" when FunctionalEnb is "on" (GeneralEnb AND FunctionalEnb equals FunctionalEnb). MidFreq is another configuration signal that can be similarly provided as HiFreq, but is asserted for signals arriving in a middle frequency range to achieve some power savings. MidFreq can provide a middle frequency mode for flip-flop operation at a frequency lower than the operating frequencies associated with the HiFreq signal, but higher operating frequencies associated with FunctionalEnb.

Flip-flop circuit 150 shows how to achieve varying levels of power savings as the frequency drops from the highest frequency to the lowest frequency. Instead of configuring the circuit for two frequency ranges (HiFreq and not HiFreq), the circuit is configured for three frequency ranges, i.e., three frequency modes (HiFreq, MidFreq, and neither HiFreq nor MidFreq (i.e., LowFreq)).

In the high frequency mode using HiFreq, there is no enable signal that can make E1 required arrival times. Therefore, HiFreq is asserted and keeps the E1 input asserted all the time. FunctionalEnb, which goes directly into the E2 enable input of flip-flop 152, is the only enable signal to the flip-flop, and thus completely describes the enabling conditions.

In the middle frequency mode using MidFreq, only the GeneralEnb signal is able to make the E1 required arrival time. Therefore, HiFreq needs to be negated and MidFreq needs to be asserted. This allows GeneralEnb to be provided to the E1 enable input. As stated previously, GeneralEnb must always be asserted when FunctionalEnb is asserted, but is probably asserted more often than FunctionalEnb. The GeneralEnb signal meets the arrival requirements for E1, and so there will be power savings when GeneralEnb is off, but on a limited basis compared to FunctionalEnb since GeneralEnb is off less often than FunctionalEnb is off.

In the lower frequency mode in which HiFreq and MidFreq signals are both negated, FunctionalEnb is able to make the E1 input required arrival times and is provided to the enable input E1. In this case, GeneralEnb is ANDed with FunctionalEnb, which is the same as FunctionalEnb (due to GeneralEnb being asserted whenever FunctionalEnb is asserted). This configuration allows there to be maximum power savings because both the E1 and E2 enables are on only when functionally necessary.

The uses of the invention can be extended to other, different configurations. The above examples are not meant to be comprehensive. For example, NOR and/or NAND gates can be used in place of the gates shown in the embodiments described above to achieve equivalent logic functionality, and/or signals can be provided at opposite logic levels than those described. Other embodiments can use additional operating frequency ranges, selected with additional configuration signals. For example, "MidHiFreq" and "MidLowFreq" can be used to select frequency ranges just above and below a middle frequency range, etc.

With the use of the circuit of the present invention, the decision as to what level of power savings can be achieved in a particular device or circuit is configurable and programmable after manufacturing (to the extent allowed by the particular embodiment of the circuit used). For example, after the circuit of the invention has been manufactured included in a device, the configuration signals (such as HiFreq or MidFreq) can either be modified via programmable registers at system start up or tied high or low via an input pin in a system. The circuit designers do not have to dedicate the circuit of the present invention for high frequency or low frequency operation at manufacturing time, as with prior designs.

The invention is a single design can take advantage of different levels of power savings in latches, based on a configuration set at runtime, i.e. "operating time" (at the beginning of or during operation of the latches). Thus the circuit of the invention is programmable in-circuit. The configuration is not set at manufacturing time or design time of the latches or system in which the latches are included. For instance, in a high frequency design, the enables may only be able to make the E2 enable required arrival time. At half of that frequency, that same E2 enable should nominally be able to make the E1 enable's required arrival time. In the prior design environment, the ability to save power at the low frequency is discarded due to the need to run at the higher frequency. In the present invention, a sequential logic device can be configured at operating time for the high frequency mode or the low frequency mode, where the device can be configured for both modes, each mode active at a different time.

One example of the use of the present invention is in portable devices. Such devices have limited power availability, and often include a "sleep" or reduced-power mode in which the device operates at a lower frequency to reduce power consumption. The present invention allows such a device to set a lower frequency operating mode for flip-flops to conserve power, and to set the flip-flops in a higher frequency operating mode when regular operation and full power is resumed.

An additional advantage is that timing tools used in design may not always model hardware accurately, and usually too conservatively. It may be that a design is sufficiently faster in hardware than in simulation such that the latch enables could have arrived in time at the E1 enable. Instead of having another costly design spin to reduce power usage by moving the E2 enables to E1 enables, a simple changing of a configuration signal, bit or input can achieve the same power savings with the same design using the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for configuring power consumption of sequential logic, the method comprising:

providing a sequential logic device including a first latch, a second latch, and first and second enable inputs, wherein the first enable input enables and disables the first latch and the second latch, and the second enable input enables and disables the second latch and does not affect the first latch, wherein the first enable input has an earlier required signal arrival time than the second enable input to be effective for a particular clock cycle; and providing circuit capability to configure the sequential logic device at operating time to operate in a lower frequency mode that consumes less power during a lower frequency of operation of the sequential logic device, and to operate in a higher frequency mode that consumes more power during a higher frequency of operation of the sequential logic device, wherein the circuit capability transmits a combined enable signal to the second enable input that completely describes the enabling conditions of the sequential logic device, the combined enable signal including a first enable signal ANDed with a second enable signal, the first enable signal having the required signal arrival time for the first enable input and the second enable signal not having the required signal arrival time for the first enable input.

2. The method of claim 1 wherein the sequential logic device is configured to consume less power by disabling both the first latch and the second latch.

3. The method of claim 1 wherein the first enable input when asserted enables a clock signal to the first latch and a clock signal to the second latch and when not asserted disables the clock signals to the first and second latches, and the second enable input when asserted enables a clock signal to the second latch and when not asserted disables the clock signal to the second latch.

4. The method of claim 1 wherein the circuit capability receives a configuration signal that selectively causes the first enable input to always enable the first latch when at least one enable signal for the sequential logic device does not meet the required signal arrival time of the first enable input.

5. The method of claim 1 wherein the circuit capability selectively causes at least one enable signal to connect to the first enable input when the at least one enable signal meets the required signal arrival time of the first enable input and causes the sequential logic device to consume less power.

6. The method of claim 1 wherein the circuit transmits a combined enable signal to the second enable input that completely describes the enabling conditions of the sequential logic device, the combined enable signal including a first enable signal ANDed with a second enable signal, wherein the enable signal and the configuration signal are provided to an OR gate having an output connected to the first enable input.

7. The method of claim 1 wherein the circuit capability receives a configuration signal that selects at operating time to configure the sequential logic device for a middle frequency of operation in which more power is consumed than during the lower frequency of operation and less power is consumed than during the higher frequency of operation.

8. A method for configuring power consumption of sequential logic, the method comprising:

selectively configuring a sequential logic device at operating time for one of a high frequency mode and a low frequency mode based on an operating frequency for the sequential logic device, wherein the sequential logic device can be configured for both modes, each mode active at a different time, and wherein the low frequency mode saves power consumption relative to the high frequency mode;

disabling both a first latch and a second latch of the sequential logic device in the low frequency mode based on a first enable signal received at a first enable input when the first enable signal meets a required signal arrival time of the first enable input; and disabling the second latch and not the first latch in the high frequency mode based on a second enable signal and the first enable signal received at a second enable input when the first enable signal does not meet the required signal arrival time of the first enable input, wherein a combined enable signal received at the second enable input completely describes the enabling conditions of the sequential logic device, the combined enable signal including a first enable signal ANDed with a second enable signal, the first enable signal having the required signal arrival time for the first enable input and the second enable signal not having the required signal arrival time for the first enable input.

9. The method of claim 8 further comprising receiving a configuration signal that selectively causes the first enable input to always enable the first latch when at least one enable signal for the sequential logic device does not meet the required signal arrival time of the first enable input.

10. The method of claim 8 further comprising selectively causing an enable signal to connect to the first enable input when the enable signal meets the required signal arrival time of the first enable input and causes the sequential logic device to consume less power.

11. A method for configuring power consumption of sequential logic, the method comprising:

providing a sequential logic device including a first latch, a second latch, and first and second enable inputs, wherein the first enable input enables and disables the first latch and the second latch, and the second enable input enables and disables the second latch and does not affect the first latch, wherein the first enable input has an earlier required signal arrival time than the second enable input to be effective for a particular clock cycle; and providing circuit capability to configure the sequential logic device at operating time to operate in a lower frequency mode that consumes less power during a lower frequency of operation of the sequential logic device, and to operate in a higher frequency mode that consumes more power during a higher frequency of operation of the sequential logic device, wherein the circuit capability transmits a combined enable signal to the second enable input that completely describes the enabling conditions of the sequential logic device, the combined enable signal including a first enable signal ANDed with a second enable signal, wherein the enable signal and the configuration signal are provided to an OR gate having an output connected to the first enable input.

12. The method of claim 11 wherein the sequential logic device is configured to consume less power by disabling both the first latch and the second latch.

13. The method of claim 11 wherein the first enable input when asserted enables a clock signal to the first latch and a clock signal to the second latch and when not asserted disables the clock signals to the first and second latches, and the second enable input when asserted enables a clock signal to the second latch and when not asserted disables the clock signal to the second latch.

14. The method of claim 11 wherein the circuit capability receives a configuration signal that selectively causes the first enable input to always enable the first latch when at least one enable signal for the sequential logic device does not meet the required signal arrival time of the first enable input.

15. The method of claim 11 wherein the circuit capability selectively causes at least one enable signal to connect to the first enable input when the at least one enable signal meets the required signal arrival time of the first enable input and causes the sequential logic device to consume less power.

16. The method of claim 11 wherein the circuit capability receives a configuration signal that selects at operating time to configure the sequential logic device for a middle frequency of operation in which more power is consumed than during the lower frequency of operation and less power is consumed than during the higher frequency of operation.

* * * * *